(12) United States Patent
Sharaa

(10) Patent No.: US 7,978,453 B2
(45) Date of Patent: Jul. 12, 2011

(54) LOW SIDE DRIVER WITH SHORT TO BATTERY PROTECTION

(75) Inventor: Imad Sharaa, Farmington, MI (US)

(73) Assignee: Visteon Global Technologies, Inc., Van Buren Township, MI (US)

(*) Notice: Subject to any disclaimer, the term of this patent is extended or adjusted under 35 U.S.C. 154(b) by 546 days.

(21) Appl. No.: 11/972,974

(22) Filed: Jan. 11, 2008

(65) Prior Publication Data

US 2009/0180223 A1 Jul. 16, 2009

(51) Int. Cl.
*H02H 3/08* (2006.01)
*H02H 9/02* (2006.01)
*H02H 3/20* (2006.01)
*H02H 9/04* (2006.01)
*H02H 9/08* (2006.01)

(52) U.S. Cl. ............. 361/93.1; 361/91.1; 361/91.5; 361/93.9

(58) Field of Classification Search .......... 361/93.1
See application file for complete search history.

(56) References Cited

U.S. PATENT DOCUMENTS

| 4,771,190 | A | * | 9/1988 | Umeki | 326/126 |
| 6,008,972 | A | | 12/1999 | Pietrobon | |
| 6,580,627 | B2 | | 6/2003 | Toshio | |
| 7,295,412 | B2 | * | 11/2007 | Sasaki et al. | 361/91.1 |

* cited by examiner

*Primary Examiner* — Dharti H Patel
(74) *Attorney, Agent, or Firm* — Dickinson Wright PLLC

(57) ABSTRACT

A driver circuit includes a driver module having a first transistor for receiving a driver voltage signal. In response to the driver voltage signal, the first transistor conducts current through an electronic device. A protection module includes a second transistor in electrical communication with the first transistor for receiving a logic voltage signal and for inhibiting current flow through the first transistor in response to receiving the logic voltage signal. The protection module further includes a digital logic gate having at least one input in electrical communication with the first transistor for detecting a short-circuit voltage signal. At least one output of the digital logic gate is in electrical communication with the second transistor for outputting the logic voltage signal in response to receiving the short-circuit voltage signal.

10 Claims, 1 Drawing Sheet

LOW SIDE DRIVER WITH SHORT TO BATTERY PROTECTION

BACKGROUND OF THE INVENTION

1. Field of the Invention

The present invention relates to electronic circuits, and specifically, to a driver circuit for conducting current through an electronic device connected to a supply voltage source.

2. Description of the Prior Art

Traditional drive circuits provide one or more transistors i.e. drivers for driving current through an inductive load. Typically, additional electronic components are provided to limit the current delivered to the driver. Under normal operating conditions, the current through the driver is further limited due to the impedance of the inductive load. However, it is possible a short-circuit in the node including the driver can occur that causes excessive current flow through the driver. As a result, the driver can be damaged.

Short-circuit protection circuits exist to protect drivers from current damage resulting from short-circuits. Traditional short-circuit protection circuits provide fully protected integrated chips preprogrammed software and additional electronic components to detect a short-circuit. In response, the microcontroller takes appropriate measures to prevent damage to the driver. Although a driver can be protected using software intervention and microcontrollers, the resulting driver circuit can be very costly, especially in high current applications.

SUMMARY OF THE INVENTION AND ADVANTAGES

In addition to the structure described above, the invention provides a protection module including a digital logic gate having at least one input in electrical communication with a first transistor for receiving a short-circuit voltage signal equal to the supply voltage from the supply voltage source. The invention further provides the digital logic gate having at least one output in electrical communication with a second transistor for outputting a logic voltage signal in response to receiving the short-circuit voltage.

Accordingly, a driver circuit having a short-circuit protection circuit is provided without requiring software intervention and to protect the first transistor, i.e. driver. Therefore, less electronic components are required and a more cost-efficient driver circuit can be constructed.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
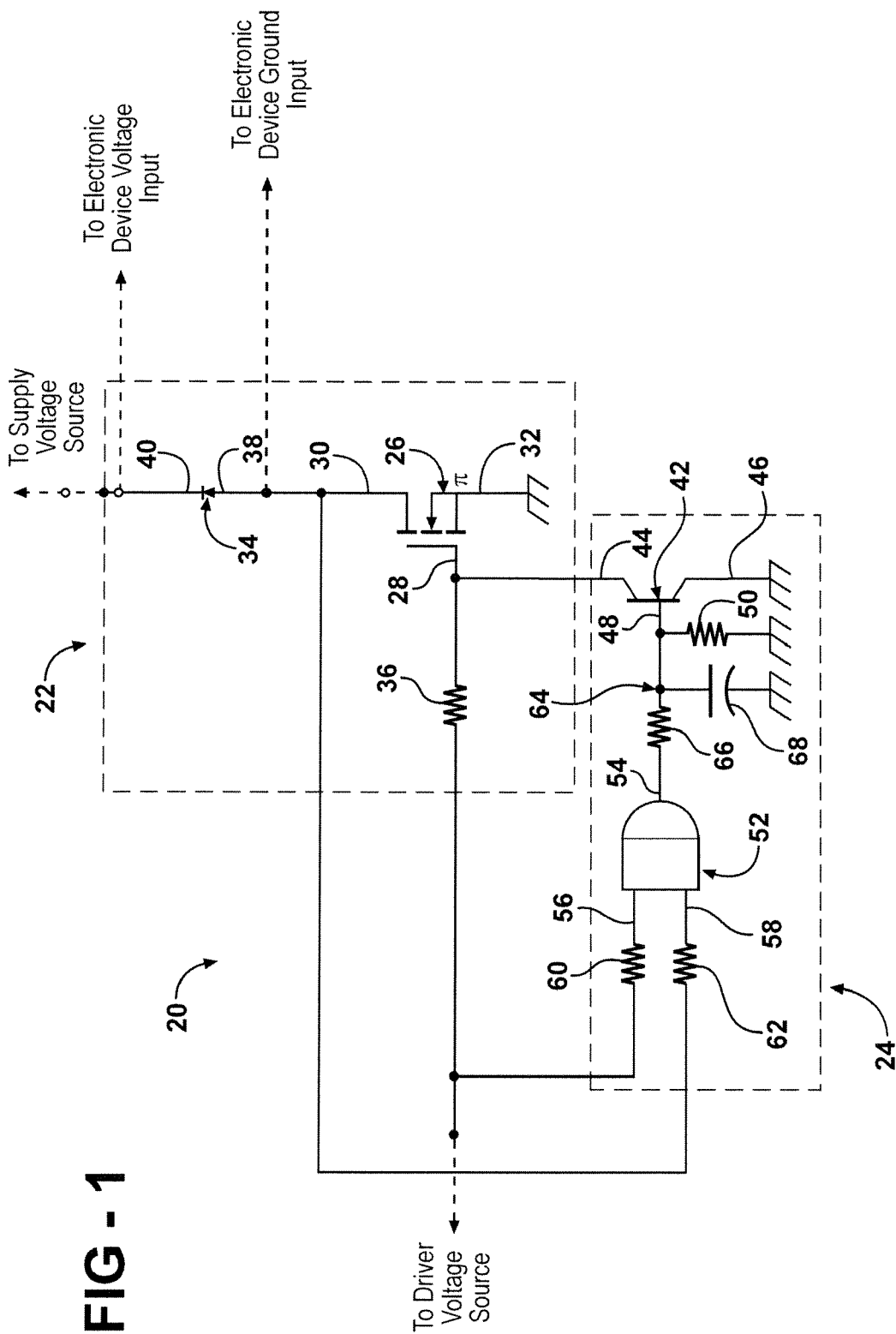
FIG. 1 is an electrical schematic of the driver circuit according to the present invention.

Referring to the Figures, wherein like numerals indicate corresponding parts throughout the several views, a driver circuit 20 is generally shown for conducting current through an electronic device (not shown) connected to a supply voltage source (not shown). The driver circuit 20 includes a driver module 22 generally indicated and a protection module 24 generally indicated. In general, the driver module 22 is connected to the supply voltage source and the electronic device.

When the driver module 22 is connected to a driver voltage source (not shown), the driver module 22 conducts current from the supply voltage source through the electronic device to provide power thereto. The driver source may be any power source that provides power to the driver module, including, but not limited to an alternating current power supply (AC power supply), a direct current power supply (DC power supply), or a pulse width modulation power supply (PWM power supply).

More specifically, the driver module 22 includes a first transistor 26 generally indicated for connecting to the driver voltage source to receive a driver voltage signal $V_{DRIVER}$. Although FIG. 1 shows the first transistor 26 as a field effect transistor 26 (FET 26), it is appreciated that another type of transistor for driving the electronic device may be used. The FET 26 includes a gate terminal 28, a drain terminal 30, and a source terminal 32. The gate terminal 28 may be connected to the driver voltage source to receive the driver voltage signal $V_{DRIVER}$. The drain terminal 30 may be connected to a ground input located on the electronic device. The source terminal 32 may be connected to a ground reference. In response to receiving the driver voltage signal $V_{DRIVER}$, the FET 26 conducts current from the supply voltage source, to the electronic device. After flowing through the electronic device, the current flows to the drain terminal 30 of the FET 26 and to the ground reference, thereby powering the electronic device.

The driver module 22 further includes a diode 34 generally indicated and a gate resistor 36. The diode 34 is disposed in a reverse biased position with the anode 38 in electrical communication with the drain terminal 30 of the FET 26. The cathode 40 may be connected to both the supply voltage source and a supply voltage input of the electronic device such that current flows in a reverse biased manner through the diode 34. As a result, a biased voltage is provided at the drain terminal 30 and current flowing to the FET 26 is regulated. The biased voltage can be predetermined based on the breakdown voltage of the diode 34 selected. The gate resistor 36 has a first end for being connected to the driver voltage source and has a second end in electrical communication with the gate terminal 28 for limiting the current delivered to the FET 26.

The protection module 24 includes a second transistor 42 generally indicated in electrical communication with the FET 26 for receiving a voltage signal and, in response, for inhibiting current flow through the FET 26. Specifically, the second transistor 42 is a bipolar junction transistor 42 (BJT 42) having a collector terminal 44, an emitter terminal 46, and a base terminal 48. The collector terminal 44 is in electrical communication with both the gate terminal 28 of the FET 26 and the second end of the gate resistor 36. The emitter terminal 46 is for connecting to a ground reference. When the base terminal 48 does not receive a voltage signal, the BJT 42 inhibits current flow between the emitter terminal 46 and the collector terminal 44. However, when the base terminal 48 receives a voltage signal, the BJT 42 is switched on and current can be conducted through the collector terminal 44 of the BJT 42 to the emitter terminal 46. Although FIG. 1. shows the second transistor 42 as a BJT 42, it can be appreciated that another type of transistor may be used. The BJT 42 also includes a pull-down resistor 50 for biasing the BJT 42 in an off state when a voltage signal is not delivered to the base terminal 48. The pull-down resistor 50 has a first end in electrical communication with the base terminal 48 of the BJT 42. The second end is electrical communication with a ground reference.

The protection module 24 is distinguished by a digital logic gate 52 generally indicated. The digital logic gate 24 includes at least one input 56, 58 and at least one output 54. At least one of the inputs 56, 58 is in electrical communication with the FET 26 for detecting a short-circuit voltage signal $V_{SHORT}$. In response to detecting the short-circuit voltage signal $V_{SHORT}$, the digital logic gate 52 generates a logic voltage signal $V_{LOGIC}$ from the output 54. The short-circuit voltage signal $V_{SHORT}$ occurs when the node including the anode 38 of the diode 34 and the drain terminal 30 of the FET 26 is short-circuited to the supply voltage source, thereby providing a voltage at the drain terminal 30 that is equal to the supply voltage output 54 by supply voltage source. A short-circuit is undesirable since the drain terminal 30 is essentially connected directly to the supply voltage source causing an excessive level of current to flow from the drain terminal 30 to the source terminal 32, thereby damaging the FET 26.

Referring to FIG. 1, the digital logic gate 52 is an AND gate 52 having a first input 56, a second input 58 and an output 54. In general, when the AND gate 52 simultaneously receives a voltage signal on the first and second inputs 56, 58, the AND gate 52 generates an output voltage signal. Otherwise, if neither, or only one of the inputs 56, 58 receive a voltage signal, the AND gate 52 does not generate an output 54. Referring to FIG. 1, the first input 56 is in electrical communication with the first end of the gate resistor 36 for receiving the driver voltage signal $V_{DRIVER}$ when the driver module 22 is connected to the driver voltage source. The second input 58 is in electrical communication with both the anode 38 of the diode 34 and the drain terminal 30 of the FET 26. The output 54 is in electrical communication with the base terminal 48 of the BJT 42 for generating a logic voltage signal $V_{LOGIC}$, as described further below. The AND gate 52 further includes first and second logic resistors 60, 62 for limiting the current flow into the inputs 56, 58 of the AND gate 52. The first logic resistor 60 has a first end in electrical communication with the first input 56 of the AND gate 52 and has a second end in electrical communication with the first end of the gate resistor 36. The second logic resistor 62 has a first end in electrical communication with the second input 58 of the AND gate 52 and has a second end in electrical communication with both the anode 38 of the diode 34 and the drain terminal 30 of the FET 26.

Under normal operating conditions, a short-circuit at the drain terminal 30 of the FET 26 will not exist. The first input 56 receives the driver voltage signal $V_{DRIVER}$ from the driver voltage source, but the second input 58 does not receive the short-circuit voltage signal $V_{SHORT}$. Accordingly, the AND gate 52 will not generate the logic voltage signal $V_{LOGIC}$. As a result, the BJT 42 remains switched off and current is conducted from the supply voltage source to the electronic device. The current remains flowing through the electronic device and to the FET 26 where it flows through the drain terminal 30 and to the source terminal 32, thereby powering the electronic device.

When a short-circuit exists at the drain terminal 30 while the FET 26 is connected to the driver voltage source, the AND simultaneously receives the driver voltage signal $V_{DRIVER}$ and the short-circuit voltage signal $V_{SHORT}$. Accordingly, the AND gate 52 outputs 54 the logic voltage signal $V_{LOGIC}$ to the base terminal 48 of the BJT 42. In response to receiving the logic voltage signal $V_{LOGIC}$, the BJT 42 switches on and conducts current from the gate terminal 28 of the FET 26, through the collector terminal 44 of the BJT 42 and to the emitter terminal 46. By sinking current from the gate terminal 28, the FET 26 switches off and inhibits current flow through the drain terminal 30, thereby protecting the FET 26 from excessive current damage. The FET 26 will remain switched off and will inhibit current flow therethrough until the short-circuit is removed.

The protection circuit may also include a low-pass filter 64 generally indicated. The low-pass filter 64 includes a filter resistor 66 and a filter capacitor 68. The filter resistor 66 has a first end in electrical communication with the output 54 of the AND gate 52. The second end is in electrical communication with the base terminal 48 of the BJT 42. The capacitor has a first end in electrical communication with both the second end of the filter resistor 66 and the base terminal 48 of the BJT 42. The second end may be in electrical communication with a ground reference.

In situations where the driver source is a PWM source that generates a pulse width modulated driver voltage signal $V_{DRIVER}$ to the gate terminal 28 of the FET 26, the signals delivered to each of the inputs 56,58 of the AND gate 52 are continuously switching between logic HI and logic LO states and can result in the overlap of the signals. The signal overlap can cause imprecise readings at the inputs 56,58 and can cause the AND gate 52 to improperly detect a short-circuit should one occur at the drain terminal 30 of the FET 26. The low-pass filter 64 delays the logic voltage signal $V_{LOGIC}$ from the AND gate 52 such that the logic voltage signal $V_{LOGIC}$ is generated when a short-circuit exists at the drain terminal 30, thereby switching on the BJT 42 to switch off and protect the FET 26. In situations where the driver source is a DC source, the driver voltage signal $V_{DRIVER}$ is a traditional DC signal. When the driver source is off, the default value of the first input 56 is 0V. When the DC source is switched on, the signal delivered to the first input 56 of the AND gate 52 is always HI based on the DC signal generated by the DC driver voltage source. Accordingly, when driver voltage source initially generates the driver voltage signal $V_{DRIVER}$, the FET 26 is switched on and the low-pass filter 64 is provided to delay any output from the AND gate 52, thereby compensating for the initialization of FET 26 to more precisely detect a short-circuit.

Therefore, the protection module 24 provides a simple low-cost AND gate 52 to switch off the FET 26 should a short-circuit at the drain terminal 30 occur. Since expensive software intervention is not required and less electrical components are needed, a more cost efficient driver circuit 20 capable of protecting against short-circuits can be achieved.

While the invention has been described with reference to an exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A driver circuit for conducting current through an electronic device connected to a supply voltage source comprising:
 a driver module including a first transistor for connecting to a driver voltage source for receiving a driver voltage signal and for conducting current from the supply voltage source through the electronic device and through said first transistor in response to receiving said driver voltage signal;
 a protection module including a second transistor in electrical communication with said first transistor for receiving a voltage signal and for inhibiting current flow through said first transistor in response to receiving the voltage signal;

said protection module including a digital logic gate having at least one input in electrical communication with said first transistor for receiving a short-circuit voltage signal equal to the supply voltage from the supply voltage source and having at least one output for outputting a logic voltage signal, in response to receiving said short-circuit voltage signal, to said second transistor;

wherein said first transistor is a field effect transistor having a gate terminal for connecting to the driver voltage source to receive said driver voltage signal and having a drain terminal for connecting to the electronic device and having a source terminal in electrical communication with a ground reference for conducting current from the electronic device through said drain terminal to said source terminal in response to said gate terminal receiving said driver voltage signal;

wherein said second transistor is a bipolar junction transistor having a base terminal for receiving a logic voltage signal and having a collector terminal in electrical communication with said gate terminal of said field effect transistor and having an emitter terminal in electrical communication with a ground reference for conducting current from said gate terminal of said field effect transistor through said collector terminal to said emitter terminal in response to receiving said logic voltage signal for inhibiting current flow through said field effect transistor;

a pull-down resistor having a first end in electrical communication with said base terminal of said bipolar junction transistor and having a second end in direct electrical communication with a ground reference;

wherein said digital logic gate is an AND gate having a first input in electrical communication with said first transistor for detecting said short-circuit voltage signal and having a second input for being connected to the driver voltage source for receiving said driver voltage signal and having an output for outputting said logic voltage signal to said second transistor in response to simultaneously receiving said short-circuit voltage signal and said driver voltage signal;

wherein said first input of said AND gate is in electrical communication with said gate terminal of said field effect transistor for receiving said driver voltage signal and said second input is in electrical communication with said drain terminal of said field effect transistor and said output for outputting said logic voltage signal in response to simultaneously receiving both of said short-circuit voltage signal and said driver voltage signal;

a gate resistor having a first end in electrical communication with said first input of said AND gate and having a second end in electrical communication with said gate terminal of said field effect transistor and said collector terminal of said bipolar junction transistor; and a first logic resistor having a first end in electrical communication with said first input of said AND gate and having a second end in electrical communication with said first end of said gate resistor.

2. A driver circuit as set forth in claim 1 further comprising a low-pass filter including a filter resistor having a first end in electrical communication with said output of said AND gate and having a second end in electrical communication with said base terminal of said bipolar junction transistor.

3. A driver circuit as set forth in claim 2 wherein said low-pass filter includes a filter capacitor having a first end in electrical communication with each of said second end of said filter resistor and said base terminal of said bipolar junction transistor and having a second end in electrical communication with a ground reference.

4. A driver circuit as set forth in claim 1 further comprising a second logic resistor having a first end in electrical communication with said second input of said AND gate and having a second end in electrical communication with said drain terminal of said field effect transistor.

5. A driver circuit as set forth in claim 1 further comprising a diode having a cathode for connecting to the supply voltage source and a supply input of the electronic device and having an anode in electrical communication with each of said drain terminal of said field effect transistor and said second input of said AND gate.

6. A driver circuit for conducting current through an electronic device connected to a supply voltage source comprising:

a driver module including a first transistor for connecting to a driver voltage source for receiving a driver voltage signal and for conducting current from the supply voltage source through the electronic device and through said first transistor in response to receiving said driver voltage signal;

a protection module including a second transistor in electrical communication with said first transistor for receiving a voltage signal and for inhibiting current flow through said first transistor in response to receiving the voltage signal, said protection module including a digital logic gate having at least one input in electrical communication with said first transistor for receiving a short-circuit voltage signal equal to the supply voltage from the supply voltage source and having at least one output for outputting a logic voltage signal, in response to receiving said short-circuit voltage signal, to said second transistor; and a low-pass filter including a filter resistor and a filter capacitor connected in series between said digital logic gate and said second transistor.

7. A protection module in electrical communication with a first transistor for detecting a short-circuit comprising:

a second transistor for being connected to the first transistor and for inhibiting current flow through said first transistor in response to receiving a voltage signal;

a digital logic gate having at least one input for being connected to the first transistor to receive a short-circuit voltage signal and having at least one output for outputting a logic voltage signal, in response to receiving said short-circuit voltage signal, to said second transistor;

wherein said second transistor is a bipolar junction transistor having a base terminal for receiving a voltage signal and having a drain terminal for being connected to the first transistor and having a source terminal for conducting current from the drain terminal in response to receiving the voltage signal for inhibiting current flow through the first transistor;

a pull-down resistor having a first end in electrical communication with said base terminal of said bipolar junction transistor and having a second end in direct electrical communication with a ground reference;

wherein said digital logic gate is an AND gate having a first input for being connected to the first transistor for receiving said short-circuit voltage signal and having a second input for being connected to the driver voltage source to receive said driver voltage signal and having said output being in electrical communication with said base terminal of said bipolar junction transistor for outputting said logic voltage signal in response to simultaneously receiving said short-circuit voltage signal and said driver voltage signal; and a low-pass filter including a filter resistor in electrical communication with said AND gate and including a filter capacitor in electrical communication with said bipolar junction transistor.

8. A driver circuit as set forth in claim 7 wherein said filter resistor has a first end in electrical communication with said output of said AND gate and has a second end in electrical communication with said base terminal of said bipolar junction transistor.

9. A driver circuit as set forth in claim 8 wherein said filter capacitor has a first end in electrical communication with each of said second end of said filter resistor and said base terminal of said bipolar junction transistor and has a second end in electrical communication with a ground reference.

10. A driver circuit for conducting current through an electronic device connected to a supply voltage source comprising;

a driver module including a field effect transistor having a gate terminal for connecting to a driver voltage source to receive a driver voltage signal and having a drain terminal for connecting to a ground input of the electronic device and having a source terminal in electrical communication with a ground reference for conducting current from the electronic device through said drain terminal to said source terminal in response to said gate terminal receiving said driver voltage signal, a diode having a cathode for connecting to both the supply voltage source and a supply voltage input of the electronic device and having an anode in electrical communication with said drain terminal of said field effect transistor, a gate resistor having a first end for being connected to the driver voltage source and having a second end in electrical communication with said gate terminal of said field effect transistor, a protection module including a bipolar junction transistor having a base terminal for receiving a voltage signal and having a collector terminal in electrical communication with each of said gate terminal and said second end of said gate resistor and having an emitter terminal in electrical communication with a ground reference for conducting current from said gate terminal of said field effect transistor through said collector terminal to said emitter terminal in response to receiving the voltage signal for inhibiting current flow through said drain terminal of said field effect transistor, said protection module including an AND gate having a first input in electrical communication with said first end of said gate resistor for receiving said driver voltage signal and having a second input in electrical communication with each of said anode of said diode and said drain terminal of said field effect transistor for detecting a short-circuit voltage signal equal to the supply voltage from the supply voltage source and having an output in electrical communication with said base terminal of said bipolar junction transistor for outputting a logic voltage signal to said base terminal of said bipolar junction transistor in response to said AND gate simultaneously receiving both of said driver voltage signal and said short-circuit voltage signal, a low-pass filter including a filter resistor and a filter capacitor, said filter resistor having a first end in electrical communication with said output of said AND gate and having a second end in electrical communication with said base terminal of said bipolar junction transistor, said filter capacitor having a first end in electrical communication with each of said second end of said filter resistor and said base terminal of said bipolar junction transistor and having a second end in electrical communication with a ground reference, a first logic resistor having a first end in electrical communication with said first input of said AND gate and having a second end in electrical communication with said first end of said gate resistor, a second logic resistor having a first end in electrical communication with said second input of said AND gate and having a second end in electrical communication with each of said anode of said diode and said drain terminal of said field effect transistor, a pull-down resistor having a first end in electrical communication with each of said base terminal of said bipolar junction transistor and said second end of said filter resistor and said first end of said filter capacitor and having a second end in electrical communication with a ground reference.

* * * * *